United States Patent [19]
Fienhage et al.

[11] Patent Number: 6,157,262
[45] Date of Patent: *Dec. 5, 2000

[54] PHASE LOCKED LOOP FREQUENCY SOURCE HAVING REDUCED LOAD PULL

[75] Inventors: John F. Fienhage, Glendale; David N. Grantham, Phoenix, both of Ariz.; Mark A. Kolber, Churchville, Pa.

[73] Assignee: Honeywell International Inc., Morristown, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/995,761

[22] Filed: Dec. 22, 1997

[51] Int. Cl.⁷ ....................................................... H03L 7/18
[52] U.S. Cl. ................................ 331/25; 331/74; 331/175
[58] Field of Search ................................. 331/25, 74, 75, 331/175

[56] References Cited

U.S. PATENT DOCUMENTS

| | | | |
|---|---|---|---|
| 4,688,237 | 8/1987 | Brault | 377/48 |
| 4,802,009 | 1/1989 | Hartmeier | 331/25 |
| 4,956,797 | 9/1990 | Berard | 708/103 |
| 5,144,260 | 9/1992 | Stribling et al. | 331/10 |

FOREIGN PATENT DOCUMENTS

| | | |
|---|---|---|
| 0 618 684 A1 | 10/1994 | European Pat. Off. . |
| 0 643 494 A1 | 3/1995 | European Pat. Off. . |
| 0 691 746 A1 | 1/1996 | European Pat. Off. . |

*Primary Examiner*—Siegfried H. Grimm

[57] ABSTRACT

A phase locked loop frequency source with greatly reduced load pull susceptibility is achieved by using a voltage controlled oscillator of frequency which is neither the same as nor a harmonic or sub-harmonic of the desired output frequency, which is derived by non-integer multiplication from the voltage controlled oscillator frequency.

9 Claims, 1 Drawing Sheet

PHASE LOCKED LOOP FREQUENCY SOURCE HAVING REDUCED LOAD PULL

BACKGROUND OF INVENTION

1. Field of the Invention

This invention relates to frequency sources and more particularly to phase locked frequency sources which supply very high frequencies and high power levels.

2. Description of the Prior Art

It is often desirable to provide a frequency source which does not change frequency so as to drive apparatus such as transmitters at fixed frequencies. Crystal oscillators have been employed for such purposes but when the output frequency is very high, the cost of a crystal oscillator having that frequency is also very high. Voltage controlled oscillators (VCO) in a phase locked loop using a lower frequency crystal oscillator can be used to supply a very stable high frequency source but when the output power is large, it has been found that output signal may be coupled back (by radiation and/or by conduction) to the VCO and cause a phase shift that pulls the output frequency off the desired value.

SUMMARY OF THE INVENTION

The present invention overcomes the problem of the prior art by using a VCO which oscillates at a frequency different than the desired output frequency and specifically one which does not have an integer relationship to the desired output frequency either by harmonic or sub-harmonics thereof.

DETAILED DESCRIPTION OF THE PREFERRED EMBODIMENTS

Figure 1:
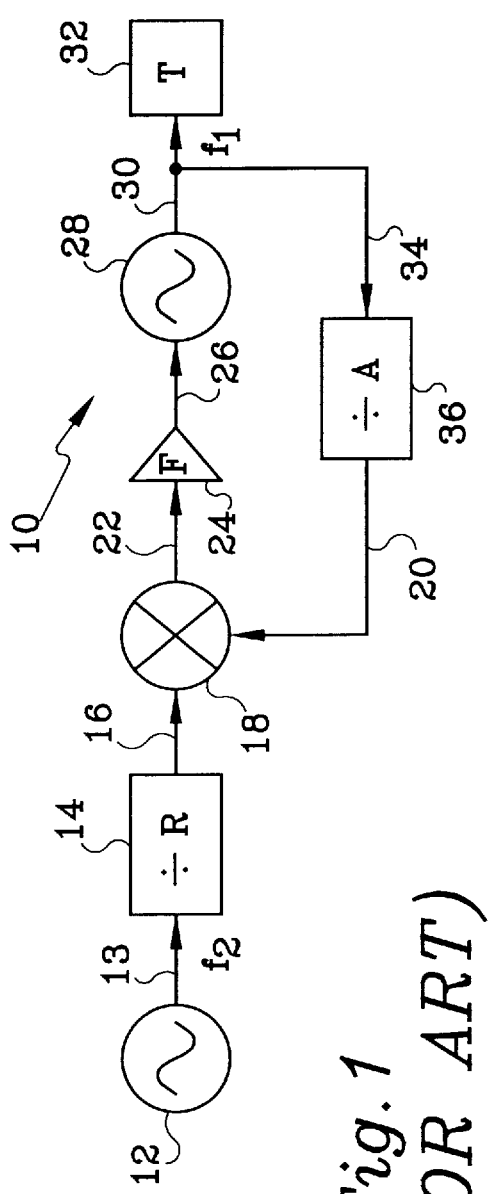
FIG. 1 is a schematic representation of a previously existing phase locked loop frequency source.

In FIG. 1, a previous constant frequency source is shown in the form of a phase locked frequency source 10 operable to produce a relatively high frequency output $f_1$. In this circuit, the frequency, $f_1$, may be, for example, 1500 MHz. The phase locked loop source 10 includes a crystal oscillator reference frequency source 12 producing a relatively low frequency, $f_2$. In this circuit, $f_2$ may be, for example, 10 MHz. It will be understood that the selection of the crystal oscillator frequency is calculated from the desired output frequency, $f_1$, and that there are often standard crystal oscillators with predetermined frequencies that can be changed with certain variables as desired. The output of crystal oscillator 12 is produced on a line 13 connected to a "divide by R" box 14 to produce an output on a line 16 to a phase detector 18. In this circuit, the value of R may be 2. Phase detector 18 also receives a feed-back signal on a line 20 and compares the two inputs to produce a phase error signal on a line 22. A signal on line 22 is filtered by loop filter 24 and is applied via line 26 to a voltage controlled oscillator (VCO) 28. VCO 28 produces the relatively high output frequency, $f_1$, on a line 30 which is used to supply a load device such as a transmitter 32. The output on line 30 is also fed back via a line 34 to a "divide by A" circuit 36 which divides the signal by a calculated value, A, which in this circuit may be 300. The divided signal is presented on the line 20 to the phase detector 18. Circuit 36 produces the feedback signal on line 20 and, during normal operation, this signal is made to be the same as the signal on line 16. Accordingly there is no change in input to filter 22 and the output frequency, $f_1$, holds constant. If frequency $f_1$ starts to change, then the feedback signal to phase detector 18 changes and the input to VCO 28 changes to bring the frequency back to $f_1$. The mathematics of the phase locked loop circuit is seen to be that the output frequency, $f_1$, (1500 MHz) divided by A (300) is 5 MHz. The crystal oscillator frequency (10 MHz) divided by R (2) is also 5 MHz.

While, with the circuit of FIG. 1, the frequency $f_1$ is supposed to be held constant, it has been found that with the high frequencies involved here and with a large power output which is needed, there is undesired coupling from the output back to the VCO 28. This coupling may occur by conductive passage through the normal RF output path and/or through the DC power and control leads and/or may also occur by radiation because of the lack of perfect shielding integrity. Further, the duration and repetition rate of the transmit pulses from transmitter 32 can be such that the frequency of the oscillator cannot be corrected by the normal feedback provided by the phase lock loop. Since the VCO output frequency and the transmitter 32 frequency, $f_1$, are the same, when the output frequency couples into the VCO 28, it is seen as increased feedback by the oscillator. This changes the phase of the feedback, causing the VCO 28 to move the output frequency to cancel this phase offset. The phase offset causes undesired moving (load pulling) of the output frequency. Here the VCO is operating on the same or an integer related frequency of the output, $f_1$, and the undesirably coupled signal is phase coherent with the VCO making the VCO very sensitive to the coupled signal.

Figure 2:
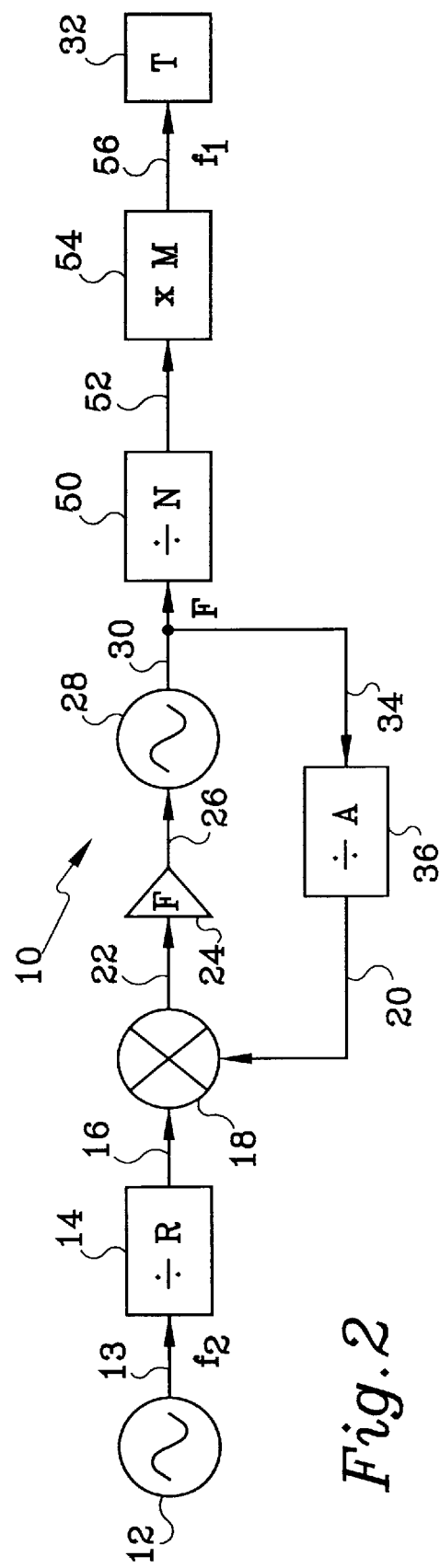
FIG. 2 is a schematic representation of the present invention.

Our solution of this problem is to make the VCO output, F, and the output signal, $f_1$ unrelated by any integer number so that there will be no phase coherence. In FIG. 2, the phase locked loop oscillator 10 and its components remain substantially the same as in FIG. 1 and have the same reference numerals. The values used in FIG. 2 are different and, for example, assuming that the desired output frequency, $f_1$, is still 1500 MHz,, the output of VCO 28 may now be set to be at 1000 MHz (a non-integer relationship to 1500 MHz). The value of A in the divide by A circuit 36 may now be 200, the value of R in the divide by R circuit 14 may now be 2 and the frequency output of the crystal oscillator 12 may now be 10 MHz. The mathematics of the FIG. 2 phase locked loop circuit is now seen to be that the output frequency, F, (1000 MHz) divided by A (200) is 5 MHz and the crystal oscillator frequency, $f_2$, (10 MHz) divided by R (2) is also 5 MHz.

In addition to the phase locked loop circuit, FIG. 2 includes a "divide by N" circuit 50 which is connected to receive the somewhat lower VCO output frequency, F, and to divide it by a low integer (e.g. 2) to produce yet lower frequency signal on a line 52. The signal on line 52 is presented to a "multiply by M" circuit 54 which multiplies the signal by a low integer value M (e.g. 3) to produce the desired output frequency, $f_1$, of 1500 MHz, on a line 56 to supply the transmitter 32. It is seen that the output signal from VCO 28 on line 30 is multiplied by 3/2 so as to equal the desired output frequency $f_1$ on line 56. In this preferred embodiment, the desired output frequency, $f_1$, is still 1500 MHz and accordingly, with N (2) and M (3), F must be 1000 MHz. (1000 MHz divided by N (2) times M (3)=1500 MHz) Now, it will be noted that the output frequency $f_1$, is a non-integer multiple of the VCO frequency, F, so that the susceptibility of the VCO 28 to any undesired coupling to the output signal is greatly reduced. While the undesired feedback does not cause frequency offset, it may cause a smaller non-constant variation at the beat frequency. This creates a small sideband signal on the VCO output that is separated from the carrier by the beat frequency and is easily removed by subsequent filtering, especially if N and M are selected to create a high beat frequency.

It is thus seen that we have provided a constant high frequency source capable of transmitting high power with little susceptibility to load pull because any undesired coupling of the output frequency $f_1$, back to the VCO's input is not seen as feedback by the VCO, since it is not the same frequency or a harmonic or sub-harmonic thereof. Therefore, the VCO's feedback does not change in phase and the VCO does not need to correct an errant phase change, thus not moving the output frequency. Many modifications to the apparatus used to describe the preferred embodiment will occur to those skilled in the art. For example, the source need not be used to power a transmitter and other loads may be employed. The crystal oscillator may be replaced with other forms of low frequency fixed reference oscillators and the various values used for A, R, M, N and the desired frequency may change with different applications. As a matter of fact, A, R, M and N can be made programmable so that the invention can be used where it is necessary to create a fixed but programmable frequency. Also, other types of frequency sources than phase locked loop frequency sources could benefit by using the invention. Accordingly, we do not wish to be restricted to the specific components used in connection with the description of the preferred embodiment.

The embodiments of the invention in which an exclusive property or right is claimed are defined as follows:

1. An apparatus for producing an output frequency comprising:

a frequency source configured to produce a source frequency as a function of a feedback signal; and frequency adjusting means operatively coupled to said frequency source, wherein said frequency adjusting means is configured to receive said source frequency and to produce said output frequency as a function of said source frequency, and wherein said frequency adjusting means adjusts said output frequency such that said output frequency is neither a harmonic nor a sub-harmonic of said source frequency (F), thereby reducing load pull in said feedback signal.

2. The apparatus of claim 1 wherein said frequency adjusting means comprises a multiplier having a first magnitude and a divider having a second magnitude.

3. The apparatus of claim 2 wherein said first magnitude is not an integer multiple of said second magnitude.

4. The apparatus of claim 3 wherein said second magnitude is not an integer multiple of said first magnitude.

5. A method of producing an output frequency comprising:

providing a frequency source configured to produce a source frequency as a function of a feedback signal;

providing a frequency adjuster operatively coupled to said frequency source, wherein said frequency adjuster is configured to receive said source frequency and to produce said output frequency as a function of said source frequency; and adjusting said output frequency at said frequency adjuster such that said output frequency is neither a harmonic nor a sub-harmonic of said source frequency to reduce load pull in said feedback signal.

6. The method of claim 5 wherein said adjusting step comprises multiplying said source frequency by a first magnitude.

7. The method of claim 6 wherein said adjusting step further comprises dividing said source frequency by a second magnitude.

8. The method of claim 7 wherein said first magnitude is not an integer multiple of said second magnitude.

9. The method of claim 8 wherein said second magnitude is not an integer multiple of said first magnitude.

* * * * *